United States Patent [19]
Bradley

[11] Patent Number: 6,025,709
[45] Date of Patent: Feb. 15, 2000

[54] ONE PORT COMPLEX TRANSMISSION AND GROUP DELAY MEASUREMENTS

[75] Inventor: Donald A. Bradley, Morgan Hill, Calif.

[73] Assignee: Wiltron Company, Morgan Hill, Calif.

[21] Appl. No.: 09/060,538

[22] Filed: Apr. 15, 1998

Related U.S. Application Data

[62] Division of application No. 08/658,745, Jun. 5, 1996, Pat. No. 5,773,985.

[51] Int. Cl.[7] ............................ G01R 27/00; H01H 47/00
[52] U.S. Cl. ...................... 324/158.1; 324/638; 307/125; 307/130
[58] Field of Search ................................. 324/642, 646, 324/158.1, 638; 307/125, 130

[56] References Cited

U.S. PATENT DOCUMENTS

| | | | |
|---|---|---|---|
| 4,399,400 | 8/1983 | Rockwell et al. | 324/540 |
| 5,243,287 | 9/1993 | Hashoian et al. | 324/318 |
| 5,387,868 | 2/1995 | Rust et al. | 324/318 |

*Primary Examiner*—Glenn W. Brown
*Attorney, Agent, or Firm*—Fliesler, Dubb, Meyer & Lovejoy

[57] ABSTRACT

A variable termination load switch (102) is provided to enable transmission and group delay measurements to be made of a device under test (DUT) (103) using only one port of a vector network analyzer (VNA) (100). The variable termination load switch (102) selectively provides an open or a short based upon a signal provided to its control input (106). The variable termination load switch (102) has a load port (113) for connecting to one port of the DUT and the VNA port is connected to another port of the DUT during testing. The variable termination load switch (102) includes a diode (143) connected by a resistor (149) to the control input (106). The diode (143) has connected parallel transistors (141, 142) and a series transistor (140) to provide a load impedance matching the DUT impedance when the load is functioning either as a short or an open. Isolation capacitors (145) and (146) reduce the affect of AC signals from the control input (106).

7 Claims, 4 Drawing Sheets

ONE PORT COMPLEX TRANSMISSION AND GROUP DELAY MEASUREMENTS

This application is a divisional application of U.S. patent application Ser. No. 08/658,745, filed Jun. 5, 1996, now U.S. Pat. No. 5,773,985.

BACKGROUND OF THE INVENTION

1. Field of the Invention

The present invention relates to the measurement of S-parameters of a device under test (DUT). More particularly, the present invention relates to a measurement device such as a vector network analyzer (VNA) configured to measure the transmission coefficient and group delay of a bi-directional two port DUT.

2. Description of the Related Art

Traditionally, a VNA having two measurement ports has been used to determine the S-parameters and group delay of a two port DUT. The S-parameters consist of $S_{11}$, $S_{12}$, $S_{21}$, and $S_{22}$. $S_{12}$ is the transmission coefficient for the first DUT port, and $S_{21}$ is the transmission coefficient for the second DUT port. Each transmission coefficient is comprised of a magnitude and a phase angle. Group delay is the change in the transmission coefficient phase angle with respect to the change in the frequency of a signal traveling through the DUT.

When using two VNA measurement ports, the transmission coefficients and group delay are measured as follows. The first DUT port is excited by a first input signal from a first VNA measurement port, and a second VNA measurement port measures an output signal at the second DUT port. The second DUT port is excited by a second input signal from the second VNA measurement port, and the first VNA measurement port measures an output signal at the first DUT port.

The $S_{12}$ transmission coefficient is determined by measuring the return loss and phase change in a signal at the second measurement port that was received through the DUT from the first measurement port. Similarly, the $S_{21}$ transmission coefficient is determined by measuring the return loss and phase change in a signal at the first measurement port that was received through the DUT from the second measurement port.

Group delay for the DUT is calculated by measuring change in the phase angle for the transmission coefficients with respect to change in the frequency. Group delay is calculated by the following equation:

$$GD = -d\Theta/d\omega; \quad (1)$$

wherein:
GD is the group delay
$\Theta$ is a transmission coefficient phase angle; and
$\omega$ is a frequency of the input signal.

However, in many cases it is not feasible to connect both ports of a two port DUT to a single VNA having two measurement ports. One example of such a two port DUT is a coaxial cable being used in a local area network that is already installed in a building. Another example is a coaxial cable connecting a transmitter/receiver to an antenna. It may be desirable to test each cable in these examples, but the two ends of the cable may physically reside at locations a significant distance from each other. Consequently, it may not be possible to reliably connect both ends of the cable to a traditional two measurement port VNA for measuring the transmission coefficients and group delay of the cable.

Further, some measurement devices only include a single measurement port. Conventional techniques of measuring transmission coefficients and group delay are not available for such a device. Such a single port measurement device is disclosed in U.S. patent application Ser. No. 08/362,179, entitled "Handheld Vector Network Analyzer", now U.S. Pat. No. 5,642,039.

Accordingly, a measurement device that can measure the transmission coefficient and group delay of a two port DUT by only using a single measurement port would be desirable.

SUMMARY OF THE INVENTION

The present invention enables a measurement device to measure the transmission coefficient and group delay of a bidirectional two port DUT using only one measurement port.

The present invention includes a measurement device using a single measurement port for coupling to a first DUT port. A programmable switch is further employed to provide a variable termination load to a second DUT port.

By appropriately controlling the programmable switch, the programmable switch applies either an open at the second DUT port or a short at the second DUT port. A processor in the measurement device receives an open reflection coefficient when the programmable switch provides an open and a short reflection coefficient when the programmable switch provides a short. The processor then calculates a transmission coefficient phase angle by using the open reflection coefficient and the short reflection coefficient measurements.

To calculate group delay the VNA repeats the above described operations to obtain a plurality of transmission coefficient magnitude and transmission coefficient phase angle measurements at different frequencies.

BRIEF DESCRIPTION OF THE DRAWINGS

Further details of the present invention are explained with the help of the attached drawings in which.

DETAILED DESCRIPTION

Figure 1:
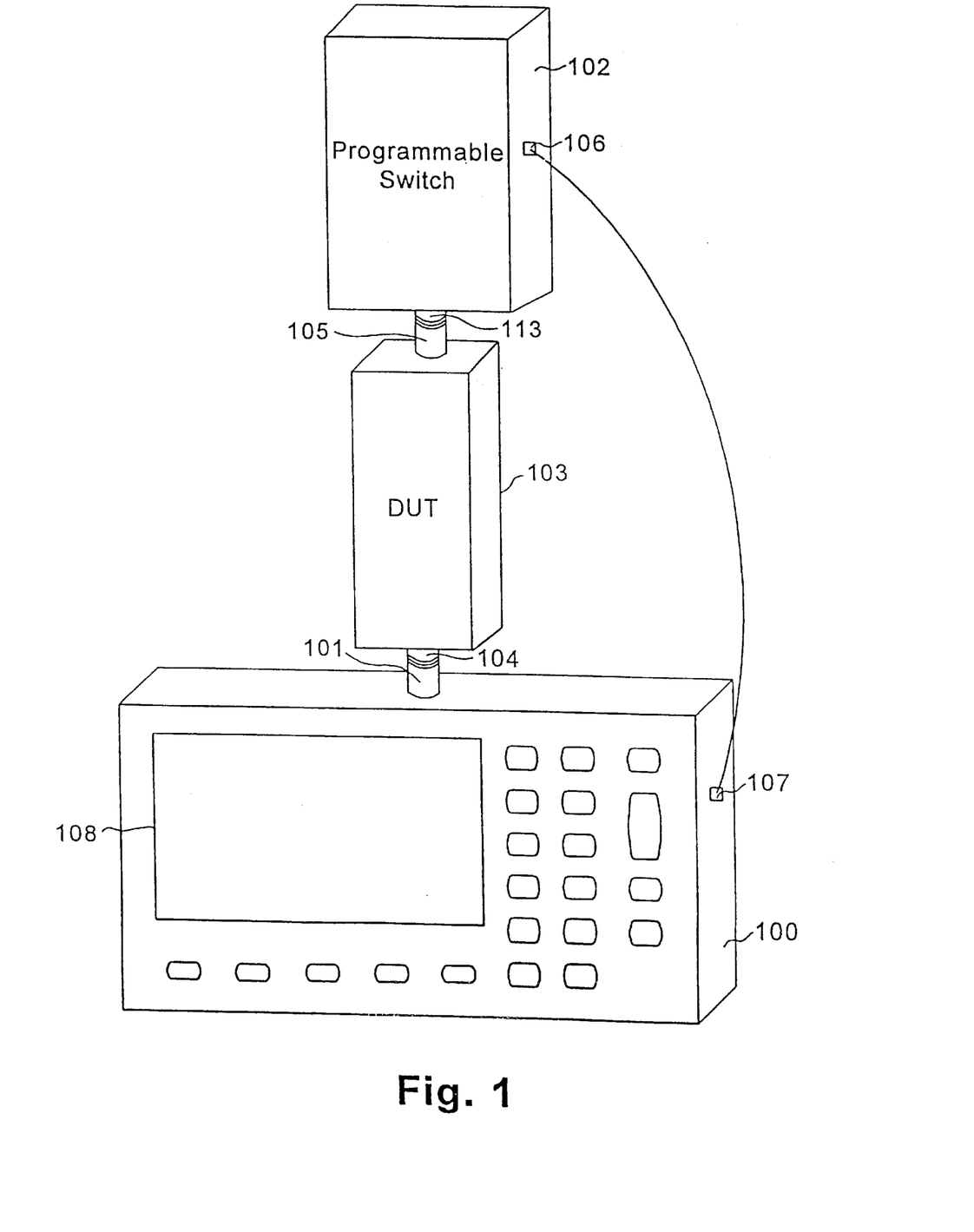
FIG. 1 illustrates a diagram of a measurement device and programmable switch of the present invention as connected to a DUT.

FIG. 1 shows a measurement device 100, such as a vector network analyzer (VNA), and a programmable switch 102 connected to a two port bi-directional device under test (DUT) 103. The measurement device 100 and the programmable switch 102 combine to provide for measuring a transmission coefficient magnitude value, transmission coefficient phase angle value, and group delay value for the two port bidirectional DUT 103. In one embodiment of the present invention, the measurement device 100 and programmable switch 102 are provided together as a transmission coefficient measurement kit.

Unlike traditional methods of determining these values, the measurement device 100 and programmable switch 102 combine to enable the values to be calculated by only providing a test signal to the first DUT port 104 and making calculations based on measurements taken only from the first DUT port 104. In contrast to the traditional method for measuring transmission coefficients, the present invention does not require the use of a measurement device, such as a VNA, with two measurement ports.

In order to interface to the bidirectional DUT 103, the measurement device 100 is equipped with a measurement port 101. The measurement port 101 can be connected directly to a first DUT port 104. The measurement device 100 provides a test signal to the first DUT port 104 through the measurement port 101 to enable the measurement of a resulting reflection coefficient at the first DUT port 104.

The measurement device 100 also includes a switch interface 107 which can transmit a signal from the measurement device 100 to a switch input 106 of the programmable switch 102 to control switching of the programmable switch 102. In one embodiment of the present invention, the switch interface 107 is physically connected to the switch input 106 through a wire, cable or other physical medium. In an alternate embodiment of the present invention, the switch interface 107 is not physically connected to the switch input 106 and employs an infrared signal transmission or other wireless means of signal transmission to transmit signals to the switch input 106.

The programmable switch 102 further includes a load port 113 for connecting to a second DUT port 105. Through the load port 113, the programmable switch 102 provides a variable termination load to the second DUT port 105. The variable termination load is connected to the DUT during the time that the measurement device 100 is supplying the test signal to the first DUT port 104 and making reflection coefficient measurements on the first DUT port 104.

The variable termination load has a characteristic impedance controlled to substantially match the characteristic impedance of the second DUT port 105. The variable termination load that is provided by the programmable switch 102 is capable of being either an open or a short. In order to set the variable termination load, the programmable switch 102 utilizes the switch input 106. In one embodiment, the variable termination load is a short when the switch input 106 receives a +12 volt signal and an open when the switch input 106 receives a −12 volt signal.

In the course of providing a variable termination load to the second DUT port 105, the programmable switch 102 causes an attenuation of the test signal passing through the DUT 103. The programmable switch 102 is designed so that the attenuation is substantially the same when the load port 113 is providing either a short or an open termination load to the second DUT port 105 with minimal reflections.

Figure 2:
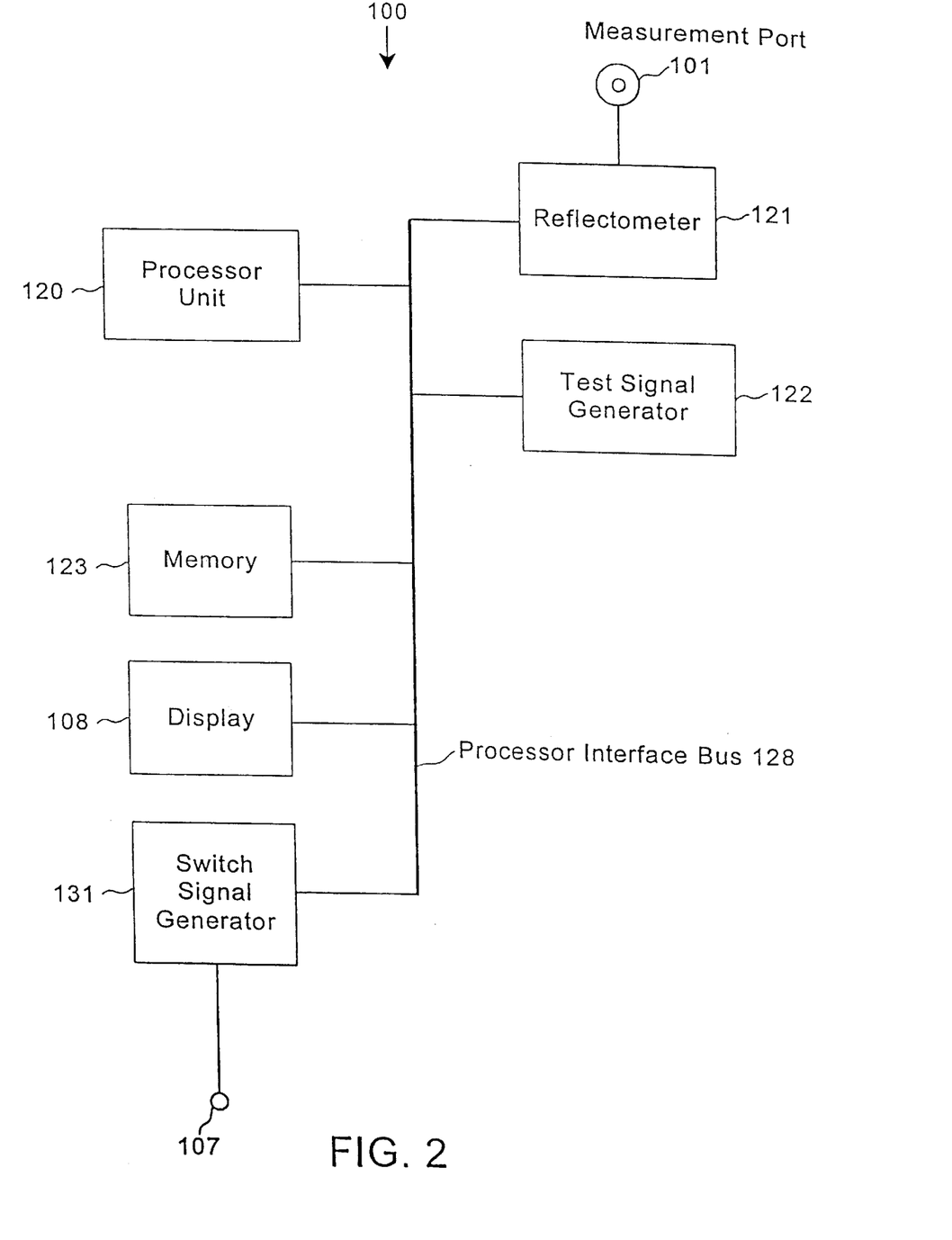
FIG. 2 illustrates a block diagram for the measurement device in FIG. 1.

FIG. 2 illustrates a block diagram of the circuitry for one embodiment of the measurement device 100 in FIG. 1. In FIG. 2 the measurement port 101 is coupled to a reflectometer 121 which receives signals from a test signal generator 122. The reflectometer 121 measures a reflection of a test signal that emanates from the first DUT port 104 through the measurement port 101. The reflection of the test signal is measured with reference to the test signal to determine a reflection coefficient.

Both the reflectometer 121 and the test signal generator 122 are coupled to a processor 120 through a processor interface bus 128. The processor 120 instructs the reflectometer 121 through the interface bus 128 when to measure an incoming signal on the measurement port 101. The processor 120 also retrieves reflection coefficient measurements made by the reflectometer 121 through the bus 128. These measurements are used by the processor 120 to calculate approximate values for the DUT's transmission coefficient magnitude, transmission coefficient phase angle, and group delay. The processor 120 also instructs the test signal generator 122 when to provide a signal and what frequency the signal should have through bus 128.

The processor 120 operates in response to program code instructions residing in a memory device 123 connected to the processor 120 through the interface bus 128. The processor 120 also stores data received from the reflectometer 121 as well as other data in memory 123. The memory 123 may be a fixed disk drive, or a floppy disk drive that retrieves instructions and data from a floppy disk. Similarly, the memory 123 may be a PCMCIA slot that retrieves instructions and data from a PCMCIA card that is loaded into the memory 123. The memory 123 may also be a random access memory (RAM) or a read only memory (ROM). In addition to instructions received from memory, the processor 120 can be controlled from a user interface such as a keypad (not shown).

The measurement device may also include a display 108 which receives and displays instructions from the processor 120 via interface bus 128.

Also included in the measurement device 100 is a switch signal generator 131 which supplies a switch signal to the switch interface 107. The switch signal provided by the switch signal generator 131 is transmitted to the switch input 106 by the switch interface 107 to set the variable termination load of the programmable switch 102 to either an open or a short. The processor 120 is connected through the interface bus 128 to the switch signal generator 131 to control its operation to enable transmission and group delay measurements to be made.

In order to calculate both a transmission coefficient magnitude value and a transmission coefficient phase angle value, the measurement device 100, in conjunction with the programmable switch 102, are employed to execute a process. One possible embodiment of the process appears in FIG. 3. In order to execute the process in FIG. 3, the processor 120 can receive data instructions from program code which may be stored in memory 123 and performs operations in accordance with the received data and instructions.

Figure 3:
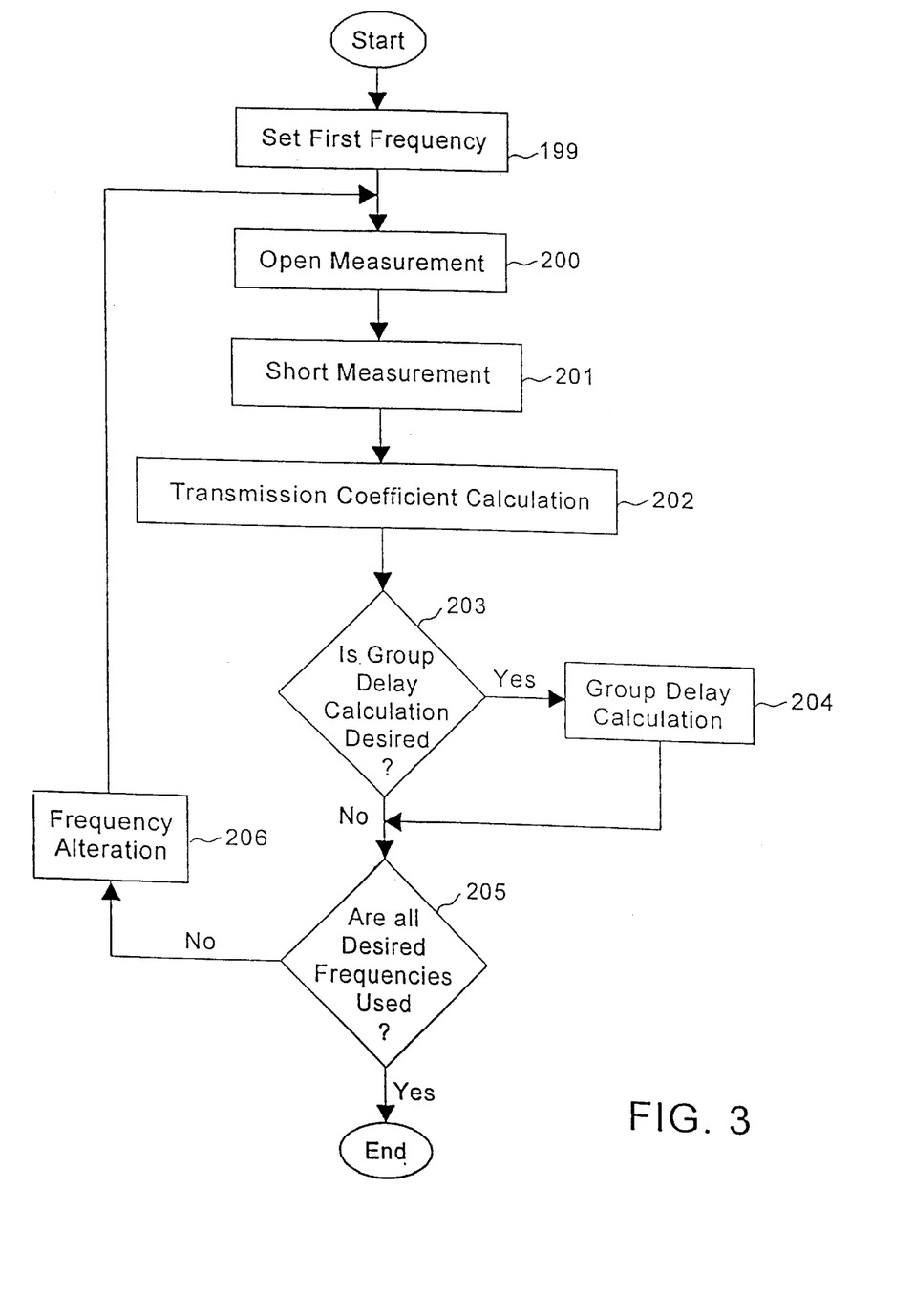
FIG. 3 illustrates a process to determine the transmission coefficient and group delay of a bi-directional two port DUT.

The process starts by setting an initial frequency for a test signal in step 199 and proceeding to an open measurement step 200. In open measurement step 200 the measurement device 100 measures a reflection coefficient defined here as an "open reflection coefficient" at the first DUT port 104, while the second DUT port 105 is terminated in an open using programmable switch 102, or other means.

In a subsequent short measurement step 201, the measurement device 100 measures a reflection coefficient defined here as a "short reflection coefficient" at the first DUT port 104, while the second DUT port 105 is terminated in a short using the programmable switch 102, or other means.

Once the measurement device 100 has measured both the open reflection coefficient and short reflection coefficient for the DUT 103, the measurement device 100, in a transmission coefficient calculation step 202, calculates both a transmission coefficient magnitude value and a transmission coefficient phase angle value for the DUT 103. In order to make these calculations, the measurement device 100 relies on the following equation:

$$\Gamma_m = S_{11} + \frac{S_{21}S_{12}\Gamma_c}{1 - S_{22}\Gamma_c} \quad (2)$$

wherein:

$\Gamma_m$ is the reflection coefficient measured from the first port 104 of the DUT 103;

$\Gamma_c$ is the known reflection coefficient for a calibration standard; and $S_{xy}$ is equivalent to $|S_{xy}|e^{-j\Theta_{xy}}$, where $|S_{xy}|$ is the magnitude component of the $S_{xy}$ S-parameter and $\Theta_{xy}$ is the phase angle component of the $S_{xy}$ S-parameter.

When the second DUT port 105 is terminated in an open, the known reflection coefficient ($\Gamma_c$) is equal to 1. When the second DUT port 105 is terminated in a short, the known reflection of the coefficient ($\Gamma_c$) is equal to −1.

In light of equation 2, subtracting the short refection coefficient of the DUT ($\Gamma_s$) from the open reflection coefficient of the DUT ($\Gamma_o$) yields the following:

$$\Gamma_o - \Gamma_s = \left[S_{11} + \frac{S_{21}S_{12}}{1 - S_{22}}\right] - \left[S_{11} - \frac{S_{21}S_{12}}{1 + S_{22}}\right] \quad (3)$$

$$\Gamma_o - \Gamma_s = \frac{S_{21}S_{12}}{1 - S_{22}} + \frac{S_{21}S_{12}}{1 + S_{22}}$$

$$\Gamma_o - \Gamma_s = \frac{(S_{21}S_{12} + S_{21}S_{12}S_{22}) + (S_{21}S_{12} - S_{21}S_{12}S_{22})}{1 - (S_{22})^2}$$

$$\Gamma_o - \Gamma_s = \frac{2S_{21}S_{12}}{1 - (S_{22})^2}$$

In the case of the bi-directional DUT 103, which will be utilized with the present invention to enable determination of the transmission coefficients $S_{12}$ and $S_{21}$ from equation 3, transmission coefficients $S_{21}$ and $S_{12}$ are substantially equal. Accordingly, equation 3 can be written as follows:

$$\Gamma_o - \Gamma_s = \frac{2(S_{21})^2}{1 - (S_{22})^2} \quad (4)$$

Since the programmable switch 102 is connected to the second DUT port 105, the reflection coefficients of the DUT measured by the measurement device 100 are affected by the attached programmable switch 102. In one embodiment of the present invention, the load port 113 is designed to have a characteristic impedance that substantially matches the characteristic impedance of the second DUT port 105. As a result, the signal reflections caused by the connection between the load port 113 and the second DUT port 105 are minimized, and can be ignored in calculating the transmission coefficient of the DUT 103. However, the attenuation provided by the programmable switch will have to be considered in determining the transmission coefficient of the DUT 103. To take into account this series attenuation, represented here as "A", equation 3 can be rewritten as follows:

$$\Gamma_o - \Gamma_s = \frac{2(S_{21})^2(S_{12})A^2}{1 - (S_{22})^2 A^4} \quad (5)$$

In order to calculate accurate approximate values for the transmission coefficient magnitude and transmission coefficient phase angle, the attenuation for the programmable switch 102 (A) is selected so that the following relationship is true:

$$(S_{22})^2 A^4 \ll 1 \quad (6)$$

In one embodiment, A is selected as 10 dB to enable ignoring $S_{22}$ reflections of a typical DUT. For greater accuracy when ignoring the $S_{22}$ reflections, A may be made greater than 10 dB. The attenuation (A) can be provided in the programmable switch 102, or by an attenuator mechanically connected to an open and then a short. With A set to reduce the effect of $S_{22}$, and considering equation 4, equation 5 can be written as follows:

$$\Gamma_o - \Gamma_s = 2(S_{21})^2 A^2 \quad (7)$$

In order to determine approximations of the magnitude and phase angle of the transmission coefficient for the DUT 103 ($S_{21}$), equation 7 can be written as follows:

$$|\Gamma_o - \Gamma_s|e^{-j\Theta_{o-s}} = 2|S_{21}|^2 A^2 (e^{-j\Theta_{21}})^2 \quad (8)$$

$$|\Gamma_o - \Gamma_s|e^{-j\Theta_{o-s}} = 2|S_{21}|^2 A^2 e^{-j2\Theta_{21}} \quad (9)$$

wherein:

$$|\Gamma_o - \Gamma_s| = 2|S_{21}|^2 A^2 \quad (10)$$

$$e^{-j\Theta_{o-s}} = e^{-j2\Theta_{21}} \quad (11)$$

$|\Gamma_o - \Gamma_s|$ is the magnitude of the difference between the open reflection coefficient of the DUT ($\Gamma_o$) and short reflection coefficient of the DUT ($\Gamma_s$);

$\Theta_{o-s}$ is the phase angle of the difference between the open reflection of the DUT ($\Gamma_o$) and the short reflection coefficient of the DUT ($\Gamma_s$);

$|S_{21}|$ is the magnitude of the DUT's 103 transmission coefficient; and $\Theta_{21}$ is the phase angle of the DUT's 103 transmission coefficient.

In order to solve for a coefficient magnitude value for the DUT 103, equation number 10 can be rewritten as follows:

$$|S_{21}|^2 = \frac{|\Gamma_o - \Gamma_s|}{2A^2} \quad (12)$$

$$|S_{21}| = \sqrt{\frac{|\Gamma_o - \Gamma_s|}{2A^2}} \quad (13)$$

Equation 12 can also be rewritten in terms of logarithms as follows:

$$20\log|S_{21}|^2 = 20\log|\Gamma_o - \Gamma_s| - 20\log\left(2\left(\text{inv. log}\left(\frac{A}{-20}\right)\right)^2\right) \quad (14)$$

$$40\log|S_{21}| = 20\log|\Gamma_o - \Gamma_s| - 20\log\left(2\left(\text{inv. log}\left(\frac{A}{-20}\right)\right)^2\right) \quad (15)$$

$$20\log|S_{21}| = \frac{20\log|\Gamma_o - \Gamma_s| - 20\log\left(2\left(inv \cdot \log\left(\frac{A}{-20}\right)\right)^2\right)}{2} \quad (16)$$

wherein:

20 log $|S_{21}|$ is an approximate value for the transmission coefficient magnitude in decibels.

In order to determine an approximate value for the transmission coefficient phase angle, equation 11 can be rewritten as follows:

$$\ln(e^{-j\Theta_{o-s}}) = \ln(e^{-j2\Theta_{21}}) \quad (17)$$

$$\Theta_{o-s} = 2\Theta_{21} \quad (18)$$

$$\Theta_{21} = \Theta_{o-s}/2 \quad (19)$$

To determine the transmission coefficient, in the calculation step 202 of FIG. 3, the processor 120 is controlled to retrieve the open reflection coefficient of the DUT 103 ($\Gamma_o$) and the short reflection coefficient of the DUT 103 ($\Gamma_s$). The processor 120 then subtracts the short reflection coefficient from the open reflection coefficient to obtain a difference. As stated previously, the difference has a magnitude ($|\Gamma_o - \Gamma_s|$) and a phase angle ($\Theta_{o-s}$).

Once the difference is determined, the processor 120 is controlled to calculate an approximate value for the DUT's 103 transmission coefficient magnitude using equation 13, or if decibels are desired by using equation 16. The processor 120 may also be controlled to calculate an approximate value for the DUT's 103 transmission coefficient phase angle ($\Theta_{21}$) by using equation 19.

After completing the transmission coefficient calculation step 202, if enough frequencies have been used and a group delay measurement is desired as determined in step 203, the processor 120 can calculate group delay in step 204. Group delay is defined as the change in the transmission coefficient phase angle of the DUT 103 with respect to the change in the frequency of the test signal. A group delay for the DUT 103 can therefore be calculated by using the following equations:

$$GD_{DUT} = \frac{-d\Theta_{21}}{d\omega} \quad (20)$$

$$GD_{DUT} = \frac{-(\Theta_{o-s(2)} - \Theta_{o-s(1)})}{2(\omega_2 - \omega_1)} \quad (21)$$

wherein:

$GD_{DUT}$ is an approximate value for the group delay of the DUT 103.

$\omega_2$ is a second frequency of the test signal provided by the measurement device 100.

$\omega_1$ is a first frequency of the test signal provided by the measurement device 100 less recently than the second frequency.

$\Theta_{o-s(1)}$ is the phase angle of the difference between the measured open reflection coefficient of the DUT 103 and the measured short reflection coefficient of the DUT 103 when the test signal has a frequency $\omega_1$.

$\Theta_{o-s(2)}$ the phase angle of the difference between the measured open reflection coefficient of the DUT 103 and the measured short reflection coefficient of the DUT 103 when the test signal has a frequency $\omega_2$.

In the group delay calculation step 204, the processor 120 is controlled to calculate an approximate group delay value ($GD_{DUT}$) by executing the operation set forth in equation 21. In order to make the calculation in equation 21, the processor 120 first retrieves $\Theta_{o-s(2)}$, $\Theta_{o-s(1)}$, $\omega_2$, and $\omega_1$.

After steps 203 or 204, if more measurements are desired at more frequencies as determined in step 205, the measurement device 100 then changes the frequency of its test signal in step 206. Once the frequency is altered, the processor 120 is controlled to return to the open measurement calculation step 200 and repeat the same operations as previously described.

If no additional frequencies are desired, the program ends and transmission coefficient magnitude values, approximate transmission coefficient phase angle values, and group delay values for the DUT 103 can be represented visually on display 108. In addition, results can be stored in memory 123 or used in subsequent calculations in the processor 120.

Figure 4:
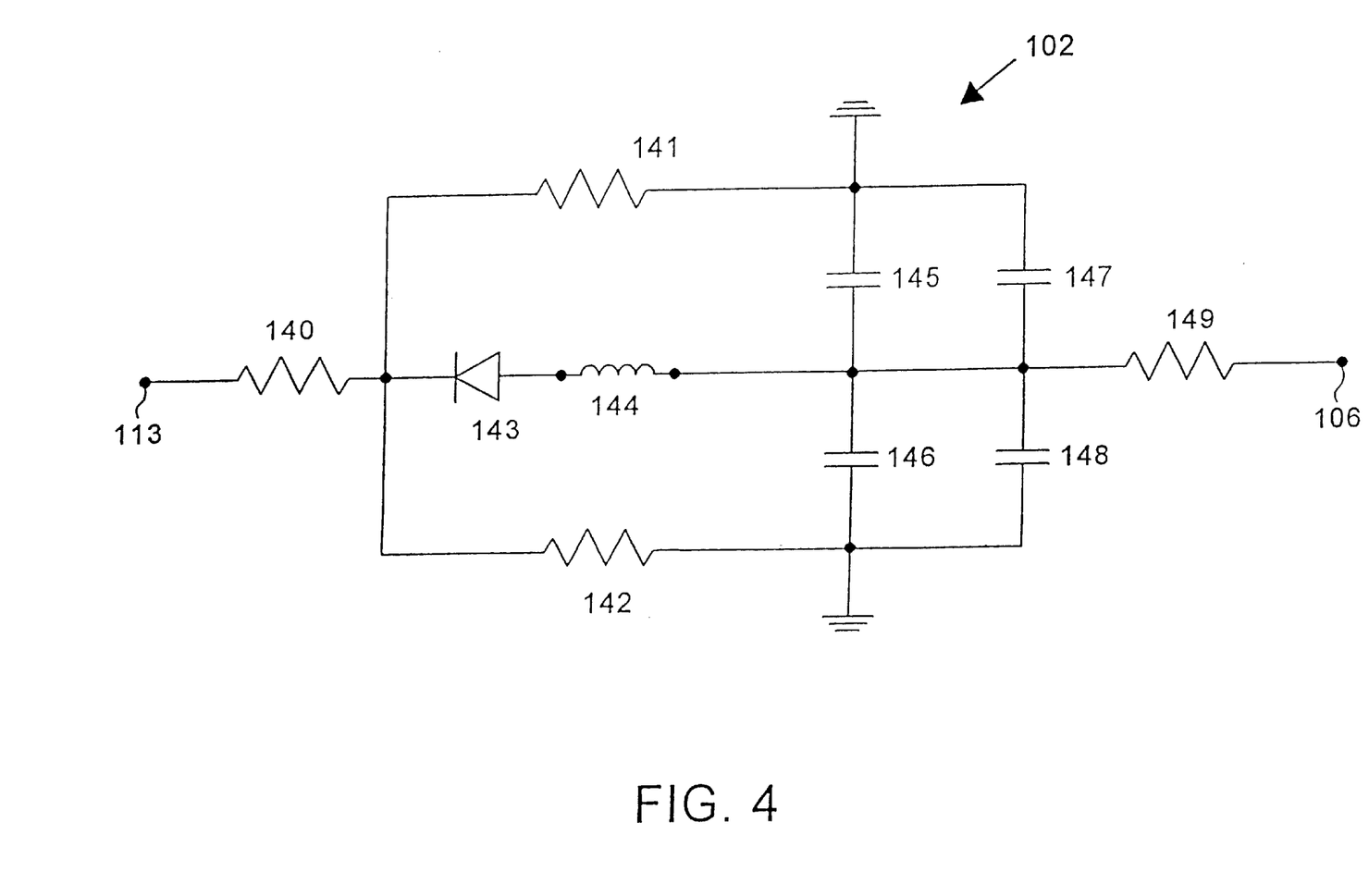
FIG. 4 illustrates circuitry of the programmable switch in FIG. 1.

FIG. 4 displays one embodiment of the circuitry for the programmable switch 102 in FIG. 1. The switch input 106 is adapted to receive a switch signal that will determine whether the variable termination load provided at the load port 113 is an open or a short. Switch input 106 is coupled to a first end of a start-up resistor 149. Start-up resistor 149 is coupled on a second end to a first end of a first isolation capacitor 147, a first end of a second isolation capacitor 148, a first end of a third isolation capacitor 145, and a first end of a fourth isolation capacitor 146. The second ends of isolation capacitors 145 and 147 are coupled to a first end of a first parallel load resistor 141 and to ground. The second ends of isolation capacitors 146 and 148 are coupled to a first end of a second parallel load resistor 142 and to ground. The second end of resistor 149 is further coupled to an anode of a diode 143. A cathode of the diode 143 is coupled to a second end of resistor 141, a second end of the resistor 142, and a first end of a serial load resistor 140. A second end of the serial load resistor 140 is coupled to the load port 113.

In FIG. 4, an inductor 144 is shown to be coupled between the anode of diode 143 and resistor 149. The inductor 144 represents an inherent inductance that exists in the connection between the resistor 149 and the diode 143. When the load port 113 of the programmable switch 102 is configured to provide an open termination load, the inductance of the inherent inductor 144 will not be seen by the second DUT port 105. When the load port 113 of the programmable switch 102 is configured to provide a short termination load, the inductance of the inherent inductor 144 will be seen by the second DUT port 105.

Accordingly, the connection between the diode 143 and the resistor 149 should be formed so as to minimize the inductance of the inherent inductor 144. By minimizing the inductance, the load port 113 is able to have a characteristic impedance that better matches the characteristic impedance of the second DUT port 105. In one embodiment of the present invention, the inherent inductor 144 only has an inductance of 0.2 nH, which has a negligible affect on the test signal and enables the transmission coefficient and group delay values to be accurately calculated by the measurement device 100 without accounting for the inductance.

The isolation capacitors 145, 146, 147, and 148 are provided to isolate the load port 113 from any alternating current elements that exist in the signal being provided at the switch input 106. The resistor 149 sets a voltage level on the anode of the diode 143, in response to a switch signal being provided at the switch input 106.

A short is provided as the termination load at the load port 113 when the switch input 106 receives a switch signal that causes the diode 143 to become forward biased. An open is provided as the termination load at the load port 113 when the switch input 106 receives a switch signal that causes the diode 143 to be reversed biased. In one embodiment of the present invention, the diode 143 is forward biased when a +12 volt signal is applied to the switch input 106, and the diode 143 is reversed biased when a −12 volt signal is applied to the switch input 106.

When the diode 143 is reversed biased, the characteristic impedance of the programmable switch 102, as seen at the load port 113, is determined by the following equation:

$$R_o = \frac{1}{\frac{1}{R_{141}} + \frac{1}{R_{142}}} + R_{140} \quad (22)$$

wherein:

$R_o$ is the characteristic impedance seen at the load port 113 when the diode 143 is reverse biased to provide an open;

$R_{141}$ is the resistance of resistor 141;

$R_{142}$ is the resistance of resistor 142; and $R_{140}$ is the resistance of resistor 140.

When the diode 143 is forwarded bias, the characteristic impedance of the programmable switch 102, as seen at the load port 113, is determined by the following equation:

$$R_s = \frac{1}{\frac{1}{R_{141}} + \frac{1}{R_{142}} + \frac{1}{R_D}} + R_{140} \quad (23)$$

wherein:

$R_s$ is the characteristic impedance seen at the load port 113 when the diode 143 is forward biased to provide a short; and $R_D$ is the resistance of the diode 143, which is typically 1 Ω.

In one embodiment of the present invention, the programmable switch 102 is designed so that the characteristic impedance of the programmable switch 102 is substantially equal to the characteristic impedance of a DUT 103 to which it is connected. This is achieved by minimizing the amount of inductance and capacitance that is seen at the load port 113, when the programmable switch 102 provides either an open load or a short load.

A voltage standing wave ratio at the load port 113 of the programmable switch 102 can be determined by using the following equations:

$$SWR_o = \frac{R_o}{R_{105}} \quad (24)$$

$$SWR_s = \frac{R_{105}}{R_s} \quad (25)$$

wherein:

$SWR_o$ is the standing wave ratio at the load port 113 when the programmable switch 102 is providing an open;

$SWR_s$ is the standing wave ratio at the load port 113 when the programmable switch 102 is providing a short; and $R_{105}$ is the characteristic impedance of the second DUT port 105.

The return loss values for the programmable switch 102 can then be calculated in decibels using the following equations:

$$RL_o = -20 \log\left(\frac{SWR_o - 1}{SWR_o + 1}\right) \quad (26)$$

$$RL_s = -20 \log\left(\frac{SWR_s - 1}{SWR_s + 1}\right) \quad (27)$$

wherein:

$RL_o$ is the return loss of the programmable switch 102 when the programmable switch 102 is providing an open; and $RL_s$ is the return loss of the programmable switch 102 when the programmable switch 102 is providing a short.

From the return loss values at the load port 113, the actual attenuation provided by the programmable switch 102 can be determined by using the following equations:

$$A_o = RL_o/2 \quad (28)$$

$$A_s = RL_s/2 \quad (29)$$

wherein:

$A_o$ is the actual attenuation of the programmable switch in decibels when the programmable switch 102 is providing an open; and $A_s$ is the actual attenuation of the programmable switch in decibels when the programmable switch 102 is providing a short.

The components of the programmable switch should be selected so that $A_o$ is substantially equal to $A_s$. Accordingly, the single attenuation factor A, where $A=A_o=A_s$, can be used by the measurement device 100 to calculate approximate values for the transmission coefficient and group delay of the DUT.

In one embodiment of the present invention, the attenuation factor (A) employed by the measurement device 100 in its calculations is 10 dB, and the characteristic impedance of the second DUT port 105 ($R_{105}$) is assumed to be 50 Ω. In such an embodiment of the present invention, the following values may be selected for the components of the programmable switch 102:

resistor 140=40.2 Ω resistor 141=43.2 Ω resister 142=39.2 Ω inductor 144=0.2 nH capacitor 147=1,100 pf capacitor 148=0.01 µf capacitor 145=220 pf capacitor 146=220 pf resistor 149=562 Ω

When the aforementioned values are used, the following results occur:

$R_o$=60.7515 Ω

$R_s$=41.1536 Ω

$SWR_o$=1.215 $\lfloor 0°$ $SWR_s$=1.215 $\lfloor 180°$ $RL_o$=20.258 dB $\lfloor 0°$ $RL_s$=20.260 dB $\lfloor 180°$ $A_o$=10.129 dB $A_s$=10.130 dB In selecting the values for components, it is important to select values so that $R_o$ and $R_s$ substantially match the characteristic impedance of the second DUT port 105 ($R_{105}$). Having $R_o$ and $R_s$ substantially match the characteristic impedance of the second DUT port 105 minimizes test signal reflections at the connection between the second DUT port 105 and the load port 113.

Finally, the load port 113 should be formed so that it provides only a minimal amount of stray capacitance to the second DUT port 105 to assure accurate measurements. In one embodiment of the present invention, the stray capacitance at the load port 113 is limited to 0.5 pf.

Although the invention has been described above with particularity, this was merely to teach one of ordinary skill in the art to make and use the invention. Many modifications will fall within the scope of the invention, as that scope is defined by the following claims.

What is claimed is:

1. A switch for providing a variable termination load to a DUT, said switch comprising:

a load port for coupling said switch to a port of said DUT;

a switch input for receiving a switch control signal; and a serial load resistor having a first terminal coupled to the load port and a second terminal;

a diode having an anode coupled to said switch input, and having a cathode coupled to the second terminal of the serial load resistor, wherein when the switch control signal is applied to the switch input in a first state the diode is reverse biased so that an open circuit is provided as the termination load to a signal applied to the load port, and when a switch control signal is applied to the switch input in a second state the diode is forward biased so that a short is provided as the termination load to a signal applied to the load port;

a first isolation capacitor having a first terminal coupled to the anode of the diode and a second terminal coupled to ground; and a first parallel load resistor having a first terminal coupled to the cathode of the diode and a second terminal coupled to the second terminal of the first isolation capacitor.

2. The switch of claim 1, wherein an attenuation value provided by the switch when the switch provides the open circuit and an attenuation value provided by the switch when the switch provides the short circuit are substantially equal.

3. The switch of claim 1, further comprising:

a start-up resistor having a first terminal coupled to said switch input and a second terminal coupled to the anode of said diode.

4. The switch of claim 1, further comprising:

a second parallel load resistor having a first terminal coupled to the cathode of the diode and a second terminal coupled to ground.

5. The switch of claim 4, further comprising:

a start-up resistor having a first terminal coupled to said switch input and a second terminal coupled to the anode of said diode.

6. The switch of claim 4, further comprising:

a second isolation capacitor having a first terminal coupled to the second terminal of said second parallel load resistor and a second terminal coupled to the anode of the diode.

7. The switch of claim 6, further comprising:

a start-up resistor having a first terminal coupled to said switch input and a second terminal coupled to the anode of said diode.

* * * * *